SEMICONDUCTOR AMPLITUDE MODULATOR APPARATUS

Filed July 24, 1961

WITNESSES

Edwin E. Bassler

James F. Young

INVENTORS
Robert Bento, Edgar L. Fogle
& Roland G. Lascola
BY Maury I. Hull
ATTORNEY United States Patent Office 3,170,126

Patented Feb. 16, 1965

3,170,126
SEMICONDUCTOR AMPLITUDE MODULATOR APPARATUS

Robert Bento, Tiverton, R.I., Edgar L. Fogle, Shirleysburg, Pa., and Roland G. Lascola, Baltimore, Md., assignors to Westinghouse Electric Corporation, East Pittsburgh, Pa., a corporation of Pennsylvania Filed July 24, 1961, Ser. No. 126,159
7 Claims. (Cl. 332—31)

Figure 1:
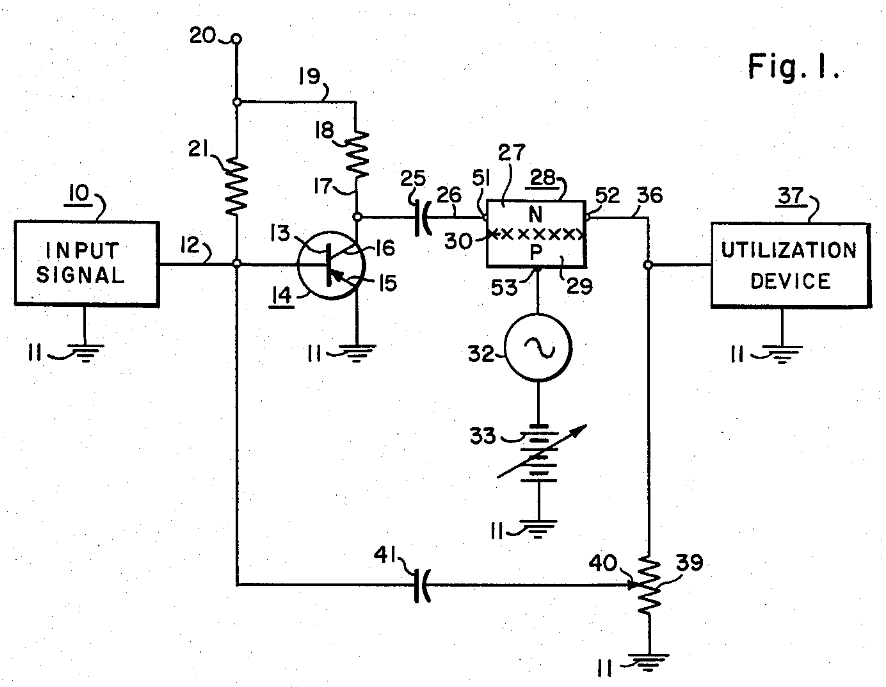

The invention relates to improvements in semiconductor amplitude modulator apparatus, and more particularly to an improved amplitude modulator employing a single transistor and a distributed parameter modulating device suitable for monolithic construction.

In prior art amplitude modulators of similar type it has been found that two transistors were necessary, and this requirement has been eliminated in the apparatus of the instant invention.

In summary, the apparatus of the instant invention provides a resistance-capacitance "tuned" RF amplifier, employing a transistor stage, in which the tuning element, in the output of the stage, is a large area back-biased p-n junction, utilized as a distributed R-C network, the output of which network is fed back to the input of the transistor stage, providing a frequency sensitive positive feedback loop, as in a tuned amplifier circuit, in which a signal to be transmitted is shifted in phase by a first element substantially 180° and thereafter shifted in phase by a second element substantially an additional 180° and applied as a positive feedback signal to the input signal point. Such a tuned amplifier, using a delay line to obtain the phase shift of the second element, is described in detail in a copending application by Barditch and Fogle entitled "Delay Cable Tuned Semiconductor Amplifier Suitable for Partial Molecularization," Serial No. 80,877, filed January 5, 1961, and assigned to the assignee of the invention presently under consideration.

Modulation is accomplished by variation of the reverse bias on the tuning element in accordance with variations in the instant amplitude of the modulating signal, which acts to change the capacitance of the reverse-biased junction and hence the frequency to which the R-C device is sensitive or is tuned. With no modulating signal present, the apparatus is "tuned" to pass a carrier signal of a certain amplitude, which is neither the maximum or minimum carrier amplitude attainable. "Detuning" of the element from the no-modulating-signal condition results in a circuit which does not pass the previous signal amplitude from an input source to an output or utilization device, but passes a signal of greater or lesser amplitude depending upon which direction the device is "detuned" by modulating signal alternations which are positive or negative, and accordingly amplitude modulation is provided.

Accordingly, a primary object of the invention is to provide new and improved semiconductor amplitude modulator apparatus.

Another object of the invention is to provide new and improved amplitude modulator apparatus in which a single transistor and a biased diode are the only required semiconductor elements, unless it is desired to produce the modulator apparatus in monolithic form in a single block of semiconductor material.

Another object is to provide a new and improved single transistor distributed parameter amplitude modulator.

Figure 2:
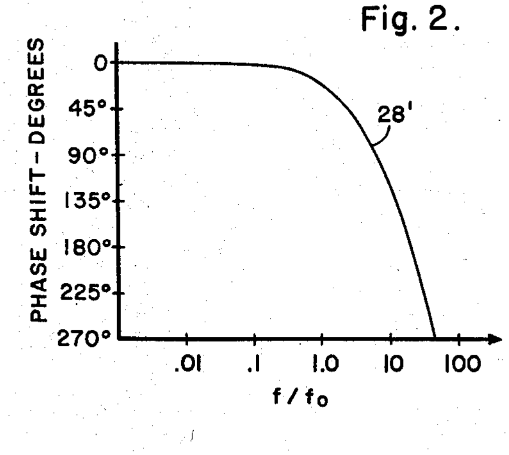
Figure 3:
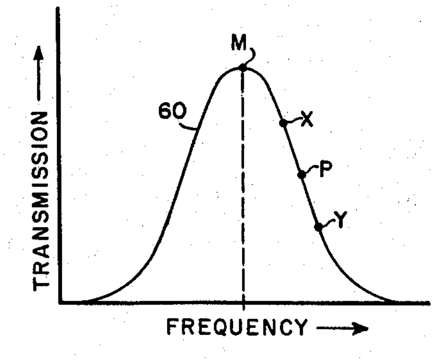

These and other objects will become more clearly apparent after a study of the following specification, when read in connection with the accompanying drawings, in which:

FIGURE 1 is a schematic equivalent electrical circuit of apparatus embodying the invention; and FIGS. 2 and 3 are graphs illustrating the operation of the apparatus of FIG. 1.

Whereas the invention is shown in FIG. 1 in schematic electrical circuit form, it will be understood that all of the elements including the resistors, leads, transistor, capacitors and reverse-biased junction may be suitably doped regions in a single block of semi-conductor material in accordance with well known molecular engineering techniques.

In FIG. 1, there is generally designated an input signal source 10 of constant frequency, which delivers its output between lead 12 and ground 11. Lead 12 is connected to the base 13 of a triode transistor generally designated 14 having emitter 15 and collector 16. The collector 16 is connected by way of lead 17, resistor 18 and lead 19 to a terminal 20 of a suitable source of direct current energizing potential, not shown, having the other terminal thereof connected to ground 11. Connected between lead 19 and the aforementioned base 13 is an additional resistor 21 for properly biasing the base 13 with respect to the emitter and collector so that the latter two elements are biased in proper directions.

The aforementioned lead 17 and collector 16 are connected by way of capacitor 25 and lead 26 to an ohmic contact 51 at one end of region 27 of a p-n junction generally designated 28, which may be rectangular in shape, the region 27 being, for example, of an n-type of semiconductivity in accordance with the polarity of a biasing source to be described more fully hereinafter, the p-n junction 28 having the other region 29 of a p-type of semiconductivity and having therebetween a junction which while the device is reverse biased, provides a depletion region 30 providing effective capacitance. Region 29 has an ohmic contact 53 thereto and is connected to a source of alternating current modulating voltage 32 and thence by way of a source of direct current biasing potential 33 of adjustable amplitude to ground 11. At the other end of the n-type region 27 is an additional ohmic contact 52 having lead 36 connected thereto, and lead 36 is connected to an input of utilization device 37 for applying a modulated output signal with respect to ground thereto. Lead 36 has potentiometer 39 connected therefrom to ground 11, and the arm 40 of potentiometer 39 is connected by way of capacitor 41 to the aforementioned lead 12 and base 13.

In the operation of the apparatus of FIG. 1, it will be noted that the p–n junction device 28 with the depletion region 30 providing capacitance forms in effect a distributed R–C network. As will be readily understood by those skilled in the art, this distributed R–C network is frequency sensitive or frequency selective and provides a phase shift through the device; for a constant biasing potential, the phase shift varies with the frequency of the signal applied to the device. A typical phase shift vs. frequency characteristic for a distributed R-distributed C low pass filter is shown by the curve 28' of the graph of FIG. 2. The attenuation vs. $f/f_0$ frequency characteristic is somewhat similar in shape; attenuation increases rapidly for signals having frequencies many times the value $f/f_0=1$. For a more complete discussion of the phase shift and attenuation characteristics of R–C semiconductor devices, and a further discussion of the graph of FIG. 2, reference may be had to an article entitled "Distributed-Parameter Networks for Microminiaturization," appearing in Electrical Manufacturing, April 1960, pp. 92–96, inclusive.

It will be readily understood, that in the apparatus of the invention, "$f$," corresponding to the carrier frequency from source 10, does not change during the modulation process, but $f_0$ varies with variations of R and C resulting from changes in the amplitude of the reverse bias on the junction, so that the ratio $f/f_0$ is changeable, and accordingly the phase shift in the device is variable according to curve 28'. A portion of the signal passing through the device 28 is applied by lead 36, potentiometer 39–40 and capacitor 41 as a feedback signal, and by proper adjustment of the circuit and selection of values for component parts, positive feedback, resulting from a phase shift of substantially 360° for the entire loop, may be provided at a frequency corresponding to or closely related to the frequency of the alternating current carrier signal from input source 10. Accordingly, this signal, because of the positive feedback, is built up in the circuit including transistor 14 and R–C network device 28. For example, a phase shift of 180° may occur in the transistor 14, and an additional phase shift of 180° for signals of a certain frequency may, in the absence of a modulating signal from source 32, occur in the distributed R–C network device 28, making a total phase shift in the loop of 360°. That a phase shift of 180° may be obtained in device 28 for signals of a certain frequency is apparent from curve 28' of FIG. 2. Adjusting the value of source 33 varies R and C, hence varies $f_0$, hence may be used to "tune" the circuit to provide 180° phase shift for signals of carrier frequency, and 360° loop phase shift.

As will be readily understood by those skilled in the art, this R–C network also has a frequency sensitive signal transmission characteristic and transmits with maximum amplitude, or least attenuation, signals below a certain frequency, depending upon the R and C values of the device. While an alternating current modulating signal is generated at 32, a periodic variation in the capacity of the device 28 occurs as a result of variation in the amplitude of the back bias applied thereto from the combined voltages of sources 33 and 32; a variation in this capacity not only may change the transmission characteristics for the signal of a frequency corresponding to the source 10, but also changes the phase shift and accordingly the amount of feedback through the loop, reducing the positive feedback at the signal frequency, and in this additional way the response of the circuit to variations in the thickness of the depletion region as a result of variations in the reverse bias on the junction is manifested.

As previously stated, modulation is accomplished by variation of the phase shift and transmission characteristics of device 28 for the frequency of the signal from source 10, by the modulating signal from source 32 applied to the p-n junction. This causes the output amplitude of the carrier of the frequency of source 10 to be varied by variations of the element 28 capacitance and resistance due to the modulating voltage. The bias source of adjustable amplitude 33 connected in series with the modulating signal source allows tuning of the amplifier to the desired frequency, and also keeps the device reverse biased for modulating signal alternations of a polarity which would tend to forward bias the device.

Particular reference is made now to FIG. 3, where curve 60 of the graph represents the total transmission vs. frequency characteristic between leads 12 and 36; thus the curve 60 shows the combined effect of variations in phase shift with variations in the frequency ratio $f/f_0$, and accordingly variations in the amount of positive feedback with variations in the frequency ratio $f/f_0$, plus the variation in the transmission characteristics of the device. Assume that in the absence of a signal from source 32, the frequency from source 10 causes operating point P at a given transmission value, the signal from 32 swings the operating point between a higher transmission value X and a lower transmission value Y, producing amplitude modulation at the output.

It will be seen that, whereas point M represents maximum transmission, and may correspond to that frequency at which a phase shift of precisely 360° occurs in the loop, that the value of bias 33 is adjusted so that in the absence of a modulating signal, the apparatus is operating at a point P not corresponding to the point of maximum transmission (or minimum attenuation); the overall circuit transmission characteristic is "swung" between low and high values by the modulating signal.

In practice, this circuit has been found to produce very little modulation distortion up to a maximum of 80° modulation, where a carrier frequency of 2 megacycles was employed, where the transistor 14 was of a type known in the trade as a 2N384. Resistor 21 had a value of 910 kilohms, resistor 18 had a value of 5.1 kilohms, potentiometer 39 had a total value of 10 kilohms, capacitor 25 had a value of 1000 p.f., and capacitor 41 had a value of 270 p.f.

As will be readily understood, one of the advantages offered by this modulating circuit is simplicity, the essential semiconductor parts being a triode transistor and a large area diode. As previously stated, the entire apparatus may be build in monolithic form wherein all of the components and leads are suitably doped regions in a single block of intrinsic semiconductor material.

It should be understood that in the claims appended hereto, such terms as "lead," "transistor," "resistor," "capacitor" may refer not to discrete elements but to suitably doped regions of a single block of semiconductor material.

Whereas the invention has been described with reference to a phase shift of 180° occurring in transistor 14, as might be expected in the grounded emitter configuration shown, that some additional phase shift resulting from high frequency effects may occur, in which case it is contemplated that $f/f_0$ will be selected or adjusted so that the total loop phase shift is the desired value.

Whereas the invention has been shown and described with respect to an embodiment thereof which gives satisfactory results, it should be understood that changes may be made and equivalents substituted without departing from the spirit and scope of the invention.

We claim as our invention:

1. Modulator apparatus comprising a source of alternating current carrier frequency signal to be amplitude modultaed, triode transistor means connected in a grounded emitter circuit configuration and having said signal applied thereto, a p-n junction device having a first region of material of a first type of conductivity and a second region of material of a second type of semiconductivity and having a wide junction area, first ohmic contact means coupling the output of said transistor means to one side of said first region, a utilization device, second ohmic contact means connected to the opposite end of said first region and connected to said utilization device, a feedback circuit means between said second ohmic contact means and the input of said transistor, a source of modulating signal potential, a source of direct current biasing potential of predetermined polarity, a third ohmic contact on said second region of said p-n junction device; circuit means including said third ohmic contact, said source of biasing potential and said source of modulating potential in series; whereby a resultant reverse bias is provided on said p-n junction device, which bias is varied in accordance with the instantaneous algebraic sum of said biasing potential and the modulating signal potential to thereby vary the transmission characteristics of said p-n junction device and said feedback circuit.

2. Modulator apparatus comprising, a circuit adapted to have impressed thereon carrier frequency signals, a utilization device, said circuit means including triode transistor means, p-n junction means having two regions of different types of semiconductivity, one of said regions having ohmic contacts included in said circuit between the output of said transistor and said utilization device, a feedback circuit connected between the output side of said one region and the input of said triode transistor, a source of modulating signal potential, a source of direct current biasing potential, circuit means connecting said source of modulating signal potential and said source of direct curren biasing potential in series to said p-n junction means in a manner to apply a reverse bias on said p-n junction, which bias varies in amplitude in accordance with the variations in the modulating signal to thereby shift the center frequency of the band of frequencies which is regeneratively passed through said circuit means between said transistor means and said utilization device to thereby vary the transmission characteristics of said circuit for the carrier frequency to thereby amplitude modulate the amplitude of the carrier signal applied to said utilization device.

3. Modulator apparatus comprising, a circuit adapted to have impressed thereon a carrier frequency signal, a utilization device, said circuit including triode transistor means and p-n junction means having two regions of different conductivity, one of said regions having ohmic contacts at its opposite ends and connected directly in said circuit, second circuit means including a source of modulating signal potential and a direct current biasing potential connected in series to an ohmic contact on the other of said regions of said p-n junction means, said direct current biasing means being connected in such a manner as to apply a reverse bias on said p-n junction means, said bias being varied in amplitude in accordance with variations in the modulating signal potential, a feedback circuit connected between the output side of said first region of said semiconductor device and the input to said triode transistor means whereby the variation in the biasing potential applied to said p-n junction means varies the transmission characteristics of the latter means and shifts the center frequency of the band of frequencies which are regeneratively passed through said transistor means and said p-n junction means to said utilization device.

4. Modulator apparatus comprising, a source of carrier frequency signals, a utilization device, a transmission circuit between said carrier source and said utilization device including a p-n junction semiconductor device having two regions of different types of semiconductor material, triode transistor means having its input connected to said carrier frequency source and having its output connected to the input end of one of said two different regions of said semiconductor device, the output end of said one region being connected to said utilization device, a source of direct current biasing potential, a source of modulating signal potential, a series circuit including said source of direct current biasing potential, said source of modulating signal potential and both of said regions of said semiconductor material, said biasing potential being connected in such a manner as to apply a reverse bias on said p-n junction, a feedback circuit from the output end of said one region to the input of said transistor whereby the variation in the biasing potential on said p-n junction semiconductor device varies the transmission characteristics of said transmission circuit by reason of the variation in the distributed capacity and resistance of said p-n junction semiconductor device which also simultaneously shifts the center of the feedback frequency band supplied to the input of said transistor thereby producing amplitude modulation of said carrier signal source.

5. Modulator apparatus comprising a circuit adapted to have impressed thereon a carrier frequency signal potential, a utilization device, said circuit including a p-n junction semiconductor device having two regions of different types of semiconductor material, the first of said regions having an input and an output ohmic contact connected directly in said circuit, triode transistor means having its input constituting the input to said circuit and having its output operatively connected to the input ohmic contact of said first region, a source of direct current biasing potential, a source of modulating signal potential; circuit means including said direct current biasing potential, said modulating signal potential source and the two regions of said p-n junction semiconductor device including a potential divider connected to the output ohmic contact of said first region; said biasing means being connected in a manner to apply a reverse bias on said p-n junction, a feedback circuit from said output ohmic contact of said first region to the input of said transistor means and including said potential divider, whereby the variation of the bias on said p-n junction device in accordance with the variations in the modulating signal potential varies the distributed resistance and capacitance of said p-n junction semiconductor device thereby shifting the center frequency of the band of the regenerative feedback signals to said transistor which in turn shifts the position of the degenerative action in the transmission band of said circuit, thereby producing amplitude modulation of the carrier signals.

6. Semiconductor modulator apparatus comprising, a carrier signal source, a transistor operatively connected to said source for translating the carrier signal, a utilization device, p-n junction means coupling the output of said transistor to said utilization device, circuit means forming a feedback path from the output of said p-n junction means to the input of said transistor, a source of modulating signal potential, a source of direct current biasing potential, circuit means connecting the modulating signal source and the source of direct current biasing potential in series with p-n junction means to apply a reverse bias of variable amplitude on said p-n junction means, thereby varying the signal transmission characteristics of said p-n junction means for said carrier signal frequency by reason of the degenerative action to the carrier path through said p-n junction means resulting from the variation in the regenerative feedback to said transistor device which shifts the center frequency of band pass of said p-n junction means.

7. Modulator apparatus comprising a transmission circuit adapted to have impressed thereon a carrier frequency signal, a utilization device, said circuit including triode signal translation means that inverts the phase of signals between its input and output independent of the frequency, a three terminal p-n junction semiconductor device which shifts the phase between its input and output as a function of frequency and capable of shifting the phase of a selected carrier frequency by substantially 180 degrees, said p-n junction device having two regions of different conductivity, an input and an output ohmic contact on one region of said device, a third ohmic contact on the other of said regions, said input ohmic contact on said first region being operatively connected to the output of said triode signal translation and the output ohmic contact being connected to said utilization device; a modulating circuit including a source of direct current biasing potential and a source of modulating signal potential connected in series with said third ohmic contact on said p-n junction device, said output ohmic contact on said first region; feedback circuit means between said output ohmic contact on said first region and the input of said triode translation means whereby the modulation of the bias potential on said p-n junction means modulates the transmission characteristics of the latter and effectively shifts the center frequency of the band of frequencies regeneratively fed back to said triode signal translation means and thereby modulates the amplitude of the carrier frequency signals passed through said transmission circuit.

References Cited in the file of this patent

UNITED STATES PATENTS

| | | |
|---|---|---|
| 2,754,431 | Johnson | July 10, 1956 |
| 2,964,637 | Keizer | Dec. 13, 1960 |
| 2,984,794 | Carter et al. | May 16, 1964 |